United States Patent
Reisiger

(10) Patent No.: US 8,665,021 B2
(45) Date of Patent: Mar. 4, 2014

(54) APPARATUS AND METHODS FOR AMPLIFIER POWER SUPPLY CONTROL

(75) Inventor: Mark Reisiger, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 30 days.

(21) Appl. No.: 13/551,435

(22) Filed: Jul. 17, 2012

(65) Prior Publication Data

US 2014/0022014 A1   Jan. 23, 2014

(51) Int. Cl.
*H03F 3/45*   (2006.01)

(52) U.S. Cl.
USPC .......................................... 330/261; 330/297

(58) Field of Classification Search
USPC ................... 330/261, 297, 285, 296
See application file for complete search history.

(56) References Cited

U.S. PATENT DOCUMENTS

| | | | |
|---|---|---|---|
| 4,577,228 A | 3/1986 | Arai et al. | |
| 5,248,946 A | 9/1993 | Murakami et al. | |
| 5,289,137 A * | 2/1994 | Nodar et al. | 330/296 |
| 5,389,892 A | 2/1995 | Embree | |
| 5,990,751 A * | 11/1999 | Takita | 330/297 |
| 6,369,652 B1 | 4/2002 | Nguyen et al. | |
| 6,803,819 B2 | 10/2004 | Kim | |
| 7,498,876 B2 * | 3/2009 | Peruzzi et al. | 330/10 |
| 7,893,766 B1 * | 2/2011 | Cranford et al. | 330/258 |

OTHER PUBLICATIONS

Datasheet for Analog Devices AD8657, *18V, Presicion, Micropower CMOS RRIO Operational Amplifier*, Mar. 2011, 24 pages (available at World Wide Web page: analog.com/en/all-operational-amplifiers-op-amps/operational-amplifiers-op-amps/ad8657/products/product.html).

Monticelli, Dennis M. *A Quad CMOS Single-Supply Op Amp with Rail-to-Rail Output Swing*, IEEE Journal of Solid-State Circuits, vol. SC-21, No. 6, Dec. 1986, pp. 1026-1034.

* cited by examiner

*Primary Examiner* — Henry Choe
(74) *Attorney, Agent, or Firm* — Knobbe Martens Olson & Bear LLP

(57) ABSTRACT

Apparatus and methods for amplifier power supply control are provided. In certain implementations, an amplifier includes an input amplification stage and a power supply control block for generating a power high supply and a power low supply for the input amplification stage. The power supply control block receives a reference signal indicative of a common-mode input voltage of the amplifier, and the power supply control block adjusts a voltage level of the power high and power low supplies while maintaining a substantially constant voltage difference between the power high and power low supplies. The power supply control block changes the voltage level of the power high and power low supplies based on the reference signal such that the voltage levels of the power high and power low supplies move in relation to the common-mode input voltage.

21 Claims, 10 Drawing Sheets

APPARATUS AND METHODS FOR AMPLIFIER POWER SUPPLY CONTROL

BACKGROUND

1. Field

Embodiments of the invention relate to electronic devices, and more particularly, to amplifiers.

2. Description of the Related Technology

An amplifier, such as an operational amplifier, can include one or more amplification stages for achieving the amplifier's overall performance. For example, the amplifier can include amplification stages cascaded to achieve a desired overall gain of the amplifier.

The input stage of the amplifier can have a relatively large impact on the performance of the amplifier. For example, the common-mode input voltage operating range of the amplifier can be limited by the common-mode input voltage operating range of the input stage. Additionally, the linearity of the input stage can be important, as a signal generated using the input stage can be amplified by subsequent gain stages.

There is a need for amplifiers having improved performance. Additionally, there is need for amplification stages having improved linearity and that can operate over a wide range of common-mode input voltages without resorting to capacitive coupling.

SUMMARY

In one embodiment, an amplifier includes a first input terminal, a second input terminal, a first amplification stage configured to amplify a voltage difference between the first and second input terminals to generate a first amplified signal, and a power supply control block configured to receive a reference signal indicative of at least one of a voltage of the first input terminal or a voltage of the second input terminal. The power supply control block is configured to generate a power high supply and a power low supply for the first amplification stage. The power supply control block is further configured to control a voltage level of the power high supply and a voltage level of the power low supply based at least in part on the reference signal. The power supply control block is further configured to generate the power low and power high supplies from a first high voltage power supply and from a second high voltage power supply.

In another embodiment, an amplifier includes a first input terminal, a second input terminal, a first amplification stage configured to amplify a voltage difference between the first and second input terminals to generate a first amplified signal, and a means for power supply control configured to receive a reference signal indicative of at least one of a voltage of the first input terminal or a voltage of the second input terminal. The power supply control means is configured to generate a power high supply and a power low supply for the first amplification stage. The power supply control means is further configured to control a voltage level of the power high supply and a voltage level of the power low supply based at least in part on the reference signal. The power supply control means is further configured to generate the power low and power high supplies from a first high voltage power supply and from a second high voltage power supply.

In another embodiment, a method of powering an amplifier is provided. The method includes receiving a first high voltage power supply and a second high voltage power supply, generating a power low supply and a power high supply from the first and second high voltage power supplies, receiving a reference signal indicative of at least one of a voltage of a first input terminal of the amplifier or a voltage of a second input terminal of the amplifier, controlling a voltage level of the power high and power low supplies based at least in part on the reference signal, powering an input amplification stage of the amplifier with the power high and power low supplies, and powering an output amplification stage of the amplifier with the first and second high voltage power supplies.

DETAILED DESCRIPTION OF EMBODIMENTS

Figure 1A:
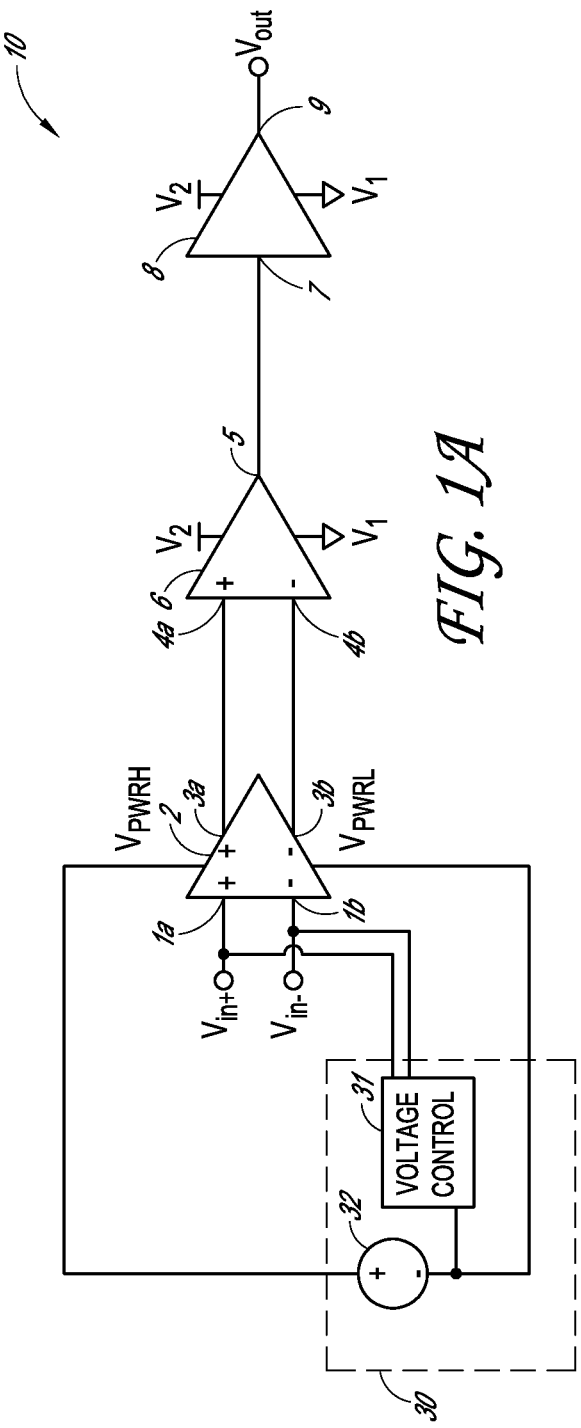
FIG. 1A is a schematic diagram of one embodiment of an amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Certain amplifiers can be manufactured using a process that includes low voltage and high voltage transistors. The low voltage transistors can have enhanced performance relative to the high voltage transistors, such as higher transconductance, lower flicker noise, and/or lower offset per unit area. However, the low voltage transistors can also have a lower breakdown voltage relative to the high voltage transistors. For example, in a field-effect transistor (FET) implementation, a low voltage FET can have a lower drain-to-source and/or gate-to-source breakdown voltage than a high voltage FET fabricated using the same manufacturing process.

The input amplification stage of an amplifier can have a relatively large impact on the overall performance of an amplifier. Thus, it can be desirable for the input amplification stage to have high performance, such as low noise, low power consumption, high linearity, and/or a relatively wide common-mode input voltage operating range that extends at least from rail to rail. Since low voltage transistors can provide enhanced performance relative to high voltage transistors, it can be desirable to use low voltage transistors in the amplifier's input amplification stage, such as in an input transistor differential pair. However, using low voltage transistors in the input transistor differential pair can result in the low voltage transistors reaching breakdown voltages over all or a portion of the amplifier's operating conditions, such as for certain values of common-mode input voltage.

Apparatus and methods for amplifier power supply control are provided. In certain implementations, an amplifier includes an input amplification stage and a power supply control block for generating a power high supply and a power low supply for the input amplification stage. The power supply control block receives a reference signal indicative of a common-mode input voltage experienced by the amplifier, and the power supply control block adjusts a voltage level of the power high and power low supplies while maintaining a substantially constant voltage difference between the power high and power low supplies. The power supply control block changes the voltage level of the power high and power low supplies based on the reference signal such that the voltage levels of the power high and power low supplies move in relation to the common-mode input voltage. By configuring the power supply control block in this manner, the input amplification stage can be advantageously configured with low voltage transistors without exceeding the breakdown voltages of the low voltage transistors over the common-mode input voltage operating range.

FIG. 1A is a schematic diagram of one embodiment of an amplifier 10. The amplifier 10 includes a first or input amplification stage 2, a second amplification stage 6, a third or output amplification stage 8, and a power supply control block 30. The amplifier 10 can be used, for example, as an operational amplifier.

The amplifier 10 includes a positive or non-inverted input voltage terminal $V_{in+}$, a negative or inverted input voltage terminal $V_{in-}$, and an output voltage terminal $V_{out}$. The first amplification stage 2 includes a non-inverted input 1a, an inverted input 1b, a non-inverted output 3a, and an inverted output 3b. The second amplification stage 6 includes a non-inverted input 4a, an inverted input 4b, and an output 5. The third amplification stage 8 includes an input 7 and an output 9.

The non-inverted and inverted inputs 1a, 1b of the first amplification stage 2 are electrically connected to the non-inverted and inverted input voltage terminals $V_{in+}$, $V_{in-}$ of the amplifier 10, respectively. The non-inverted and inverted outputs 3a, 3b of the first amplification stage 2 are electrically connected to the non-inverted and inverted inputs 4a, 4b of the second amplification stage 6, respectively. The output 5 of the second amplification stage 6 is electrically connected to the input 7 of the third amplification stage 8, and the output 9 of the third amplification stage 8 is electrically connected to the output voltage terminal $V_{out}$ of the amplifier 10.

The amplifier 10 can be used to amplify a differential input voltage signal received on the non-inverted and inverted input voltage terminals $V_{in+}$, $V_{in-}$ to generate an amplified output voltage signal on the output voltage terminal $V_{out}$. For example, the first amplification stage 2 can be used to amplify a difference between the non-inverted and inverted input voltage terminals $V_{in+}$, $V_{in-}$ to generate an amplified voltage signal between the non-inverted and inverted outputs 3a, 3b of the first amplification stage 2, which can be further amplified by the second amplification stage 6 and the third amplification stage 8 to generate the amplified output voltage signal on the output voltage terminal $V_{out}$.

By using a plurality of amplification stages, wherein plurality means two or more, such as the first, second and third amplification stages 2, 6, 8, a desired overall open-loop gain for the amplifier 10 can be achieved. For example, in some configurations, the amplifier 10 can have a gain about equal to the product of the gain of the first amplification stage 2, the gain of the second amplification stage 6, and the gain of the third amplification stage 8. Accordingly, amplification stages can be cascaded to obtain a desired overall gain of the amplifier 10. Additionally, using a plurality of amplification stages in the amplifier 10 can aid in increasing the input impedance and/or reducing the output impedance of the amplifier 10 relative to an amplifier using a single stage.

The first or input amplification stage 2 can have a relatively large impact on the performance of the amplifier 10. For example, since the non-inverted and inverted input voltage terminals $V_{in+}$, $V_{in-}$ are electrically connected to the non-inverted and inverted inputs 1a, 1b of the first amplification stage 2, respectively, the common-mode input voltage operating range of the amplifier 10 can be impacted by the common-mode input voltage operating range of the first amplification stage 2. Additionally, linearity and/or noise of the first amplification stage 2 can have a relatively large impact on the overall performance of the amplifier 10. For example, non-linear signal components and/or noise generated using the first amplification stage 2 can be further amplified by the second and third amplification stages 6, 8.

The power supply control block 30 includes a voltage control block 31 and a voltage source 32, and can be used to generate a power high supply $V_{PWRH}$ and a power low supply $V_{PWRL}$ for the first amplification stage 2. While illustrated in FIGS. 1A-2B with the voltage source 32 in the signal path between the voltage control block 31 and, directly or indirectly, the power high supply $V_{PWRH}$, in alternative embodiments, the voltage source 32 can be in the signal path between the voltage control block 31 and, directly or indirectly, the power low supply $V_{PWRL}$, or split among both paths as illustrated later in connection with FIGS. 3A and 3B.

In contrast to second and third amplification stages 6, 8 that are powered using a first or high voltage power low supply $V_1$ and a second or high voltage power high supply $V_2$, the first amplification stage 2 is powered using power high and power low supplies $V_{PWRH}$, $V_{PWRL}$ generated by the power supply control block 30. As will be described below, the voltage difference between the power high and power low supplies $V_{PWRH}$, $V_{PWRL}$ can be less than the voltage difference between the high voltage power high and power low supplies $V_2$, $V_1$, thereby permitting the use of low voltage transistors in the first amplification stage 2. For example, using the power high and power low supplies $V_{PWRH}$, $V_{PWRL}$ can aid in biasing a low voltage input transistor differential pair over a range of operating conditions without exceeding any breakdown voltages of the low voltage input transistor differential pair.

The power supply control block 30 can use the voltage source 32 to maintain a substantially constant voltage difference between the power high and power low supplies $V_{PWRH}$, $V_{PWRL}$ over the common-mode input voltage operating range of the non-inverted and inverted input voltage terminals $V_{IN+}$, $V_{IN-}$. Additionally, the power supply control block 30 can use the voltage control block 31 to move or change the voltage levels of the power high and power low supplies $V_{PWRH}$, $V_{PWRL}$ in relation to the common-mode input voltage such that the voltage levels of the power high and power low supplies $V_{PWRH}$, $V_{PWRL}$ track or move with respect to the common-mode input voltage. Configuring the power supply control block 30 to generate the power high and power low supplies $V_{PWRH}$, $V_{PWRL}$ in this manner can aid in reducing variation in the biasing conditions of the transistors of the input amplification stage 2 over changes in common-mode input voltage, thereby allowing the input amplification stage 2 to use low voltage transistors while avoiding biasing conditions associated with breakdown.

In one embodiment, when the common-mode input voltage is relatively far from the voltage of the high voltage power high supply $V_2$ and from the voltage of the high voltage power low supply $V_1$, the voltage control block 31 can control the voltage of the power high supply $V_{PWRH}$ to be about equal to $V_{CM}+V_{32}/2$ and the voltage of the power low supply $V_{PWRL}$ to be about equal to $V_{CM}-V_{32}/2$, where $V_{CM}$ is the common-mode input voltage and $V_{32}$ is about equal to the voltage of the voltage source 32. Additionally, when the common-mode input voltage is close to the voltage of the high voltage power high supply $V_2$, the voltage control block 31 can control the voltage of the power high supply $V_{PWRH}$ to be about equal to the voltage of the high voltage power high supply $V_2$ and can control the voltage of the power low supply $V_{PWRL}$ to be about equal to $V_2-V_{32}$, where $V_2$ is the voltage of the high voltage power high supply $V_2$. Similarly, when the common-mode input voltage is close to the voltage of the high voltage power low supply $V_1$, the voltage control block 31 can control the voltage of the power low supply $V_{PWRL}$ to be about equal to the voltage of the high voltage power low supply $V_1$ and can control the voltage of the power high supply $V_{PWRH}$ to be about equal to $V_1+V_{32}$, where $V_1$ is the voltage of the high voltage power low supply $V_1$. Thus, the power supply control block 30 can be configured to generate the power high and power low supplies $V_{PWRH}$, $V_{PWRL}$ such that the power high and power low supplies $V_{PWRH}$, $V_{PWRL}$ track the common-mode input voltage while clamping or limiting the power high and power low supplies $V_{PWRH}$, $V_{PWRL}$ at the high voltage power high and power low supplies $V_2$, $V_1$, respectively.

Although the amplifier 10 of FIG. 1A illustrates a configuration including three stages, the amplifier 10 can be adapted to include more or fewer stages, including stages of the same and/or of a different type. Additionally, although the open-loop gain of the amplifier 10 is typically greater than 1, each of the amplification stages need not have a gain greater than 1. For example, in some implementations, the third amplification stage 8 can be a low gain buffer stage configured to boost the output impedance of the amplifier 10. Furthermore, although FIG. 1 illustrates a configuration in which the amplifier 10 generates a single-ended output voltage signal, the amplifier 10 can be adapted to generate other output signals, including, for example, a differential output voltage signal and/or a single-ended or differential output current signal.

Figure 1B:
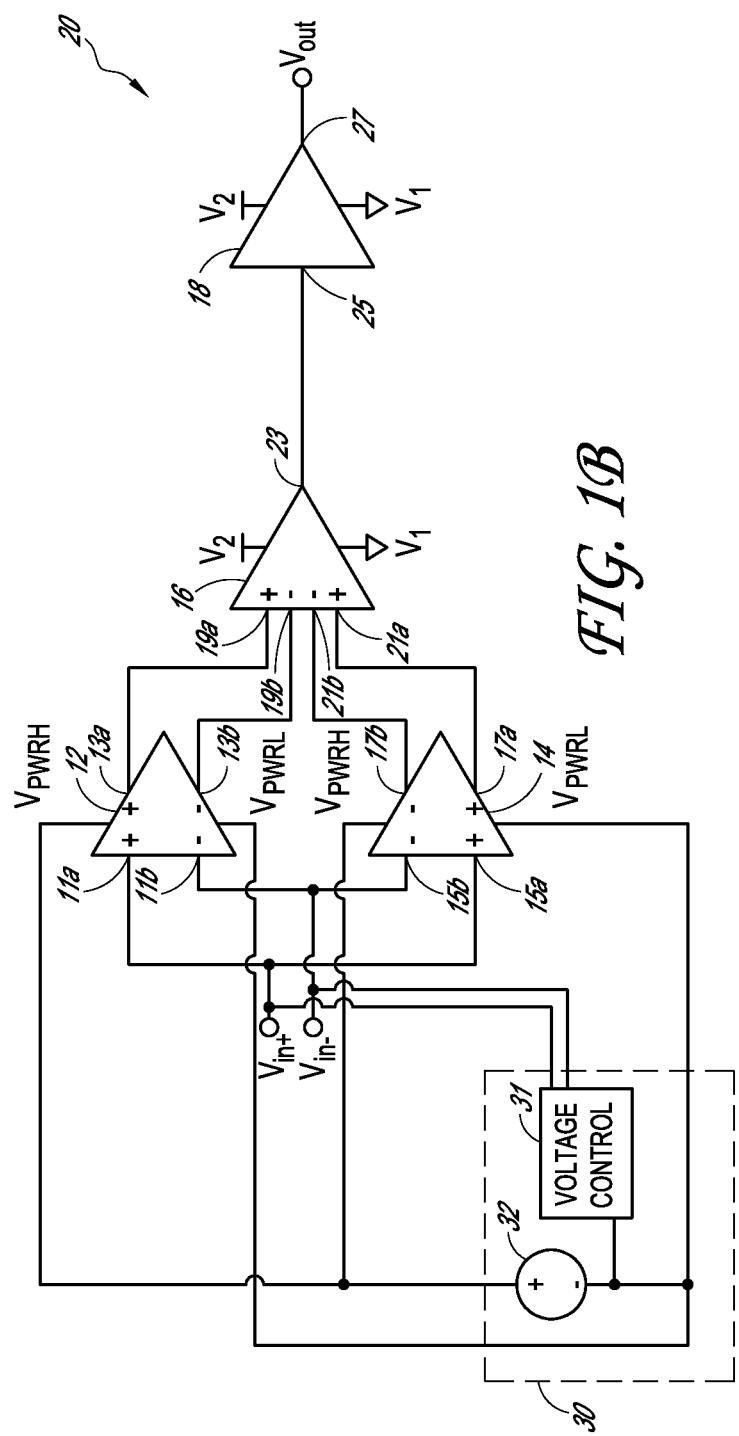
FIG. 1B is a schematic diagram of another embodiment of an amplifier.

FIG. 1B is a schematic diagram of another embodiment of an amplifier 20. The amplifier 20 includes a first amplification stage 12, a second amplification stage 14, a third amplification stage 16, a fourth amplification stage 18, and the power supply control block 30.

The amplifier 20 includes a non-inverted input voltage terminal $V_{in+}$, an inverted input voltage terminal $V_{in-}$, and an output voltage terminal $V_{out}$. The first amplification stage 12 includes a non-inverted input 11a, an inverted input 11b, a non-inverted output 13a, and an inverted output 13b. The second amplification stage 14 includes a non-inverted input 15a, an inverted input 15b, a non-inverted output 17a, and an inverted output 17b. The third amplification stage 16 includes a first non-inverted input 19a, a first inverted input 19b, a second non-inverted input 21a, a second inverted input 21b, and an output 23. The fourth amplification stage 18 includes an input 25 and an output 27.

The non-inverted and inverted inputs 11a, 11b of the first amplification stage 12 are electrically connected to the non-inverted and inverted input voltage terminals $V_{in+}$, $V_{in-}$ of the amplifier 20, respectively. Additionally, the non-inverted and inverted inputs 15a, 15b of the second amplification stage 14 are electrically connected to the non-inverted and inverted input voltage terminals $V_{in+}$, $V_{in-}$ of the amplifier 20, respectively. The non-inverted and inverted outputs 13a, 13b of the first amplification stage 12 are electrically connected to the first non-inverted input 19a and first inverted input 19b, respectively, of the third amplification stage 16. The non-inverted and inverted outputs 17a, 17b of the second amplification stage 14 are electrically connected to the second non-inverted input 21a and the second inverted input 21b, respectively, of the third amplification stage 16. The output 23 of the third amplification stage 16 is electrically connected to the input 25 of the fourth amplification stage 18, and the output 27 of the fourth amplification stage 18 is electrically connected to the output voltage terminal $V_{out}$ of the amplifier 20.

The amplifier 20 can be used to amplify a differential input voltage signal received on the non-inverted and inverted input voltage terminals $V_{in+}$, $V_{in-}$ to generate an amplified output signal on the output voltage terminal $V_{out}$. For example, the first amplification stage 12 can be used to amplify the difference between the non-inverted and inverted input voltage terminals $V_{in+}$, $V_{in-}$ to generate a first amplified differential voltage signal on the non-inverted and inverted outputs 13a, 13b. Additionally, the second amplification stage 14 can be used to amplify a difference between the non-inverted and inverted input voltage terminals $V_{in+}$, $V_{in-}$ to generate a second amplified differential voltage signal on the non-inverted and inverted outputs 17a, 17b. The first amplified differential voltage signal and the second amplified differential voltage signal can be combined and amplified using the third amplification stage 16 and the fourth amplification stage 18.

The power supply control block 30 has been configured to generate the power high supply $V_{PWRH}$ and the power low supply $V_{PWRL}$ for the first and second amplification stages 12, 14. Additionally, in the illustrated configuration the third and fourth amplification stages 16, 18 are powered using the high voltage power low supply $V_1$ and the high voltage power high supply $V_2$.

In contrast to the amplifier 10 of FIG. 1A, the amplifier 20 of FIG. 1B includes a plurality of input amplification stages electrically connected in parallel. For example, the first and second amplification stages 12, 14 each are electrically connected to the non-inverted and inverted input voltage terminals $V_{in+}$, $V_{in-}$ and serve as input stages for the amplifier 20. As illustrated in FIG. 1B, the power supply control block 30 has been configured to electrically power both the first and second amplification stages 12, 14.

By using a plurality of input amplification stages in the amplifier 20, the overall common-mode input voltage operating range of the amplifier 20 can be improved. For example, the first amplification stage 12 can be used to amplify the difference between the non-inverted and inverted input voltage terminals $V_{in+}$, $V_{in-}$ when the common-mode input voltage is relatively high, and the second amplification stage 14 can be used to amplify the difference between the non-inverted and inverted input voltage terminals $V_{in+}$, $V_{in-}$ when the common-mode input voltage is relatively low. Accordingly, in some implementations, a plurality of input amplification stages can be used to amplify a differential input voltage over different ranges of common-mode input voltage, with each of the input amplification stages configured to operate over a different portion of the common-mode input voltage operating range so as to improve the performance of the amplifier 20.

Figure 2A:
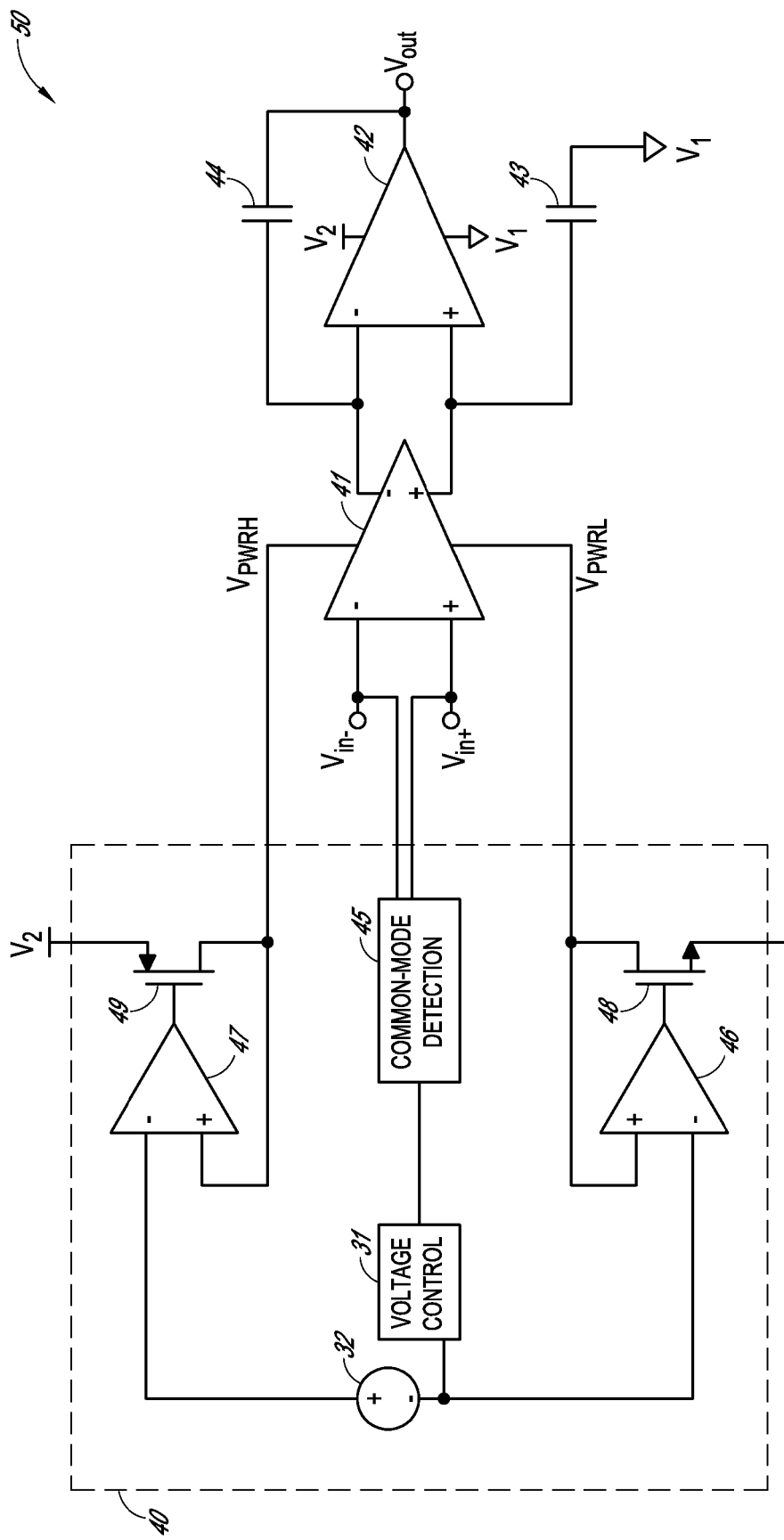
FIG. 2A is a circuit diagram of one embodiment of an amplifier.

FIG. 2A is a circuit diagram of one embodiment of an amplifier 50. The amplifier 50 includes a first or input amplification stage 41, a second output amplification stage 42, a first capacitor 43, a second capacitor 44, and a power supply control block 40. The amplifier 50 further includes a non-inverted input voltage terminal $V_{in+}$, an inverted input voltage terminal $V_{in-}$, and an output voltage terminal $V_{out}$.

The input amplification stage 41 includes a non-inverted input electrically connected to the non-inverted input voltage terminal $V_{in+}$ and an inverted input electrically connected to the inverted input voltage terminal $V_{in-}$. The input amplification stage 41 further includes a non-inverted output electrically connected to a first end of the first capacitor 43 and to a non-inverted input of the output amplification stage 42. The input amplification stage 41 further includes an inverted output electrically connected to a first end of the second capacitor 44 and to an inverted input of the output amplification stage 42. The input amplification stage 41 further includes a power high supply input configured to receive the power high supply $V_{PWRH}$ from the power supply control block 40 and a power low supply input configured to receive the power low supply $V_{PWRL}$ from the power supply control block 40. The output amplification stage 42 further includes an output electrically connected to a second end of the second capacitor 44 and to the output voltage terminal $V_{out}$. The output amplification stage 42 further includes a power high supply input electrically connected to the high voltage power high supply $V_2$ and a power low supply input electrically connected to the high voltage power low supply $V_1$. The first capacitor 43 further includes a second end electrically connected to the high voltage power low supply $V_1$.

The power supply control block 40 includes the voltage control block 31, the voltage source 32, a common-mode detection block 45, a first amplification block 46, a second amplification block 47, an n-type metal oxide semiconductor (NMOS) transistor 48, and a p-type metal oxide semiconductor (PMOS) transistor 49. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The input amplification stage 41 is configured to amplify a differential input voltage signal received between the non-inverted and inverted input voltage terminals $V_{in+}$, $V_{in-}$, to generate an amplified signal. The output amplification stage 42 is configured to receive the amplified signal, and to further amplify the amplified signal to generate an output voltage signal on the output voltage terminal $V_{out}$.

The common-mode detection block 45 includes a first input electrically connected to the non-inverted input voltage terminal $V_{in+}$, a second input electrically connected to the inverted input voltage terminal $V_{in-}$, and an output electrically connected to an input of the voltage control block 31. The voltage control block 31 further include an output electrically connected to a first terminal of the voltage source 32 and to an inverted input of the first amplification block 46. The first amplification block 46 further includes an output electrically connected to a gate of the NMOS transistor 48 and a non-inverted input electrically connected to a drain of the NMOS transistor 48 at a node of the power supply control block 40 configured to generate the power low supply $V_{PWRL}$. The NMOS transistor 48 further includes a source electrically connected to the high voltage power low supply $V_1$. The voltage source 32 further includes a second terminal electrically connected to an inverted input of the second amplification block 47. The second amplification block 47 further includes an output electrically connected to a gate of the PMOS transistor 49 and a non-inverted input electrically connected to a drain of the PMOS transistor 49 at a node of the power supply control block 40 configured to generate the power high supply $V_{PWRH}$. The PMOS transistor 49 further includes a source electrically connected to the high voltage power high supply $V_2$.

In contrast to the power supply control block 30 of FIGS. 1A-1B, the power supply control block 40 of FIG. 2A further includes the common-mode detection block 45, the first and second amplification blocks 46, 47, and the NMOS and PMOS transistors 48, 49.

The common-mode detection block 45 can generate a reference signal, which can aid the voltage control block 31 in generating an output voltage that tracks or moves with the common-mode input voltage of the non-inverted and inverted input voltage terminals $V_{IN+}$, $V_{IN-}$.

The first and second amplification blocks 46, 47 and the NMOS and PMOS transistors 48, 49 can be included to help buffer the first and second terminals of the voltage source 32 from the power high and power low supplies $V_{PWRH}$, $V_{PWRL}$, respectively. Furthermore, the first and second amplification blocks 46, 47 and the NMOS and PMOS transistors 48, 49 can aid the power supply control block 40 in generating the power high and power low supplies $V_{PWRH}$, $V_{PWRL}$ such that the power high supply $V_{PWRH}$ is clamped or limited at the high voltage power high supply $V_2$ and the power low supply $V_{PWRL}$ is clamped or limited at the high voltage power low supply $V_1$. For example, the first amplification block 46 and the NMOS transistor 48 can operate as a first low-dropout (LDO) regulator that controls the voltage level of the power low supply $V_{PWRL}$ based on a voltage level of the first terminal of the voltage source 32, while the second amplification block 47 and the PMOS transistor 49 can operate as a second LDO regulator that controls the voltage level of the power high supply $V_{PWRH}$ based on a voltage level of the second terminal of the voltage source 32.

Figure 2B:
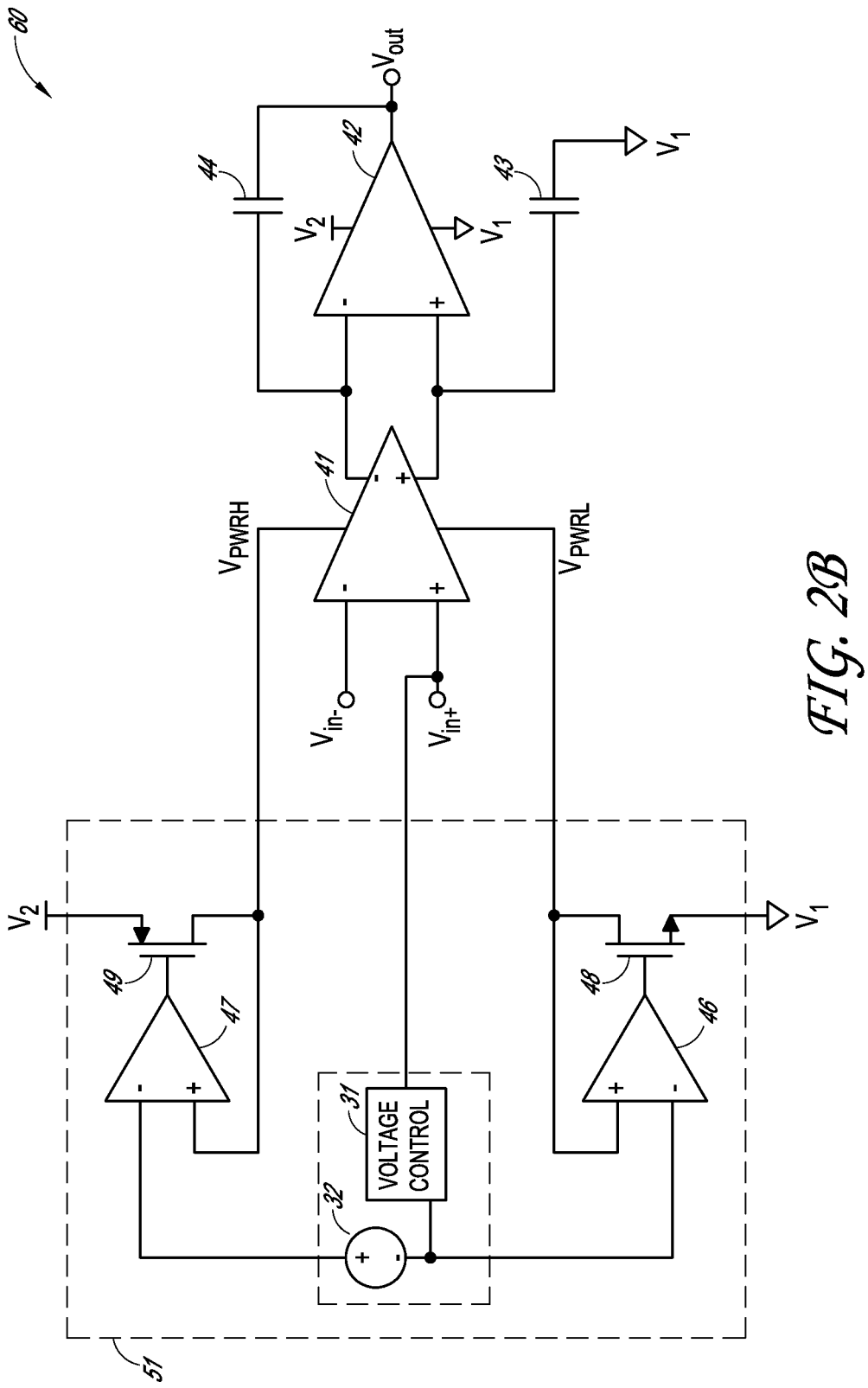
FIG. 2B is a circuit diagram of another embodiment of an amplifier.

FIG. 2B is a circuit diagram of another embodiment of an amplifier 60. The amplifier 60 includes the input amplification stage 41, the output amplification stage 42, the first capacitor 43, the second capacitor 44, and a power supply control block 51. The amplifier 60 further includes a non-inverted input voltage terminal $V_{in+}$, an inverted input voltage terminal $V_{in-}$, and an output voltage terminal $V_{out}$.

The amplifier 60 of FIG. 2B is similar to the amplifier 50 of FIG. 2A, except that the amplifier 60 includes a different arrangement of a power supply control block. For example, in contrast to the power supply control block 40 of FIG. 2A which includes the common-mode detection block 45, the power supply control block 51 illustrates a configuration in which the common-mode detection block 45 has been omitted in favor of using the voltage level of the non-inverted input voltage terminal $V_{in+}$ as a reference signal for the voltage control block 31. In certain implementations, such as in configurations in which a voltage difference between the non-inverted and inverted input voltage terminals $V_{in+}$, $V_{in-}$ is relatively small during operation, including, for example, feedback implementations of the amplifier, a voltage level of one of the input voltage terminals can be indicative of the common-mode input voltage and can be used as a reference signal for the voltage control block 31. Although FIG. 2B illustrates a configuration in which the non-inverted input voltage terminal $V_{in+}$ has been used as a reference signal, in certain implementations the inverted input voltage terminal $V_{in-}$ can be used as a reference signal.

Figure 3A:
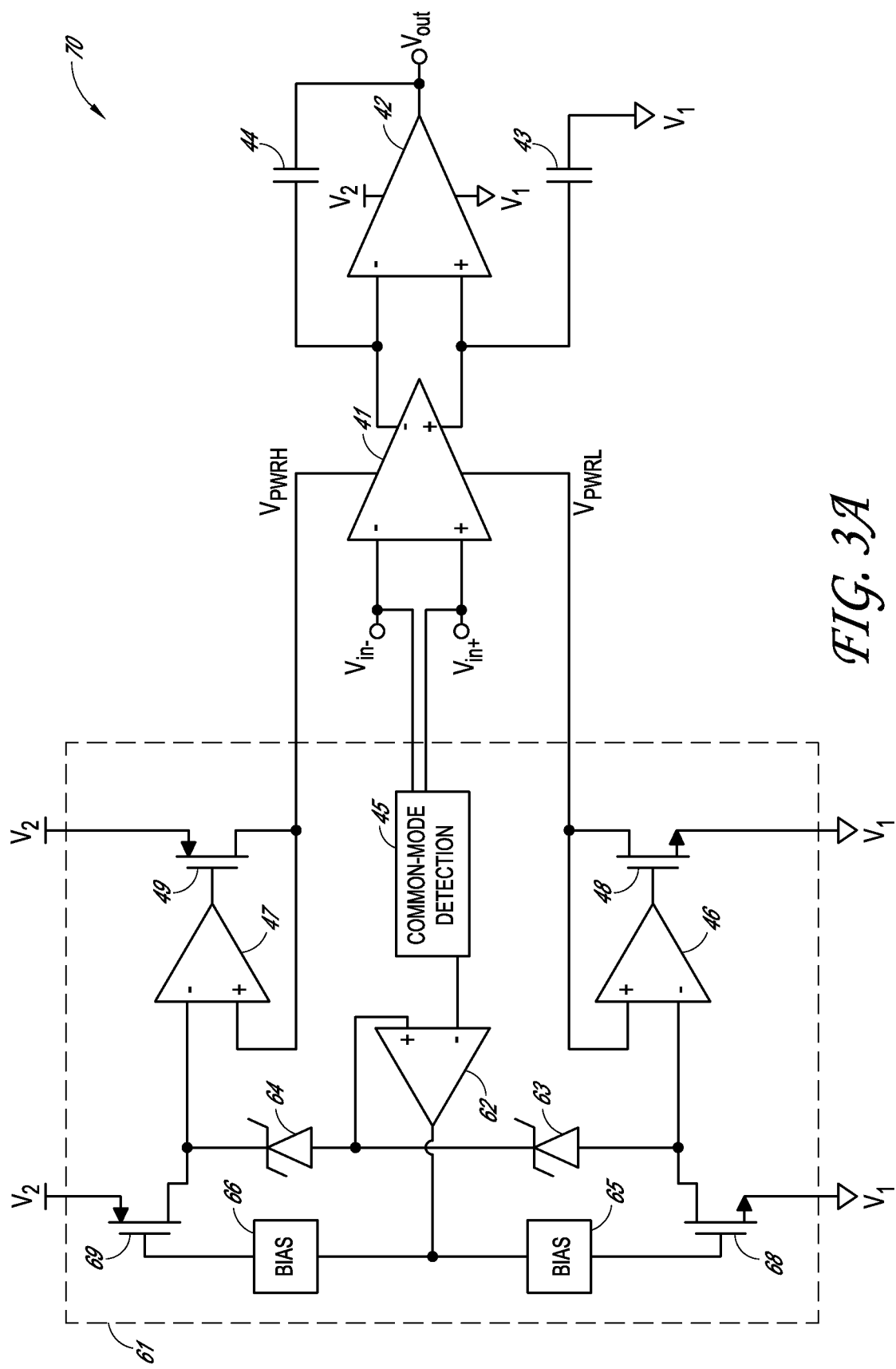
FIG. 3A is a circuit diagram of another embodiment of an amplifier.

FIG. 3A is a circuit diagram of another embodiment of an amplifier 70. The amplifier 70 includes the input amplification stage 41, the output amplification stage 42, the first capacitor 43, the second capacitor 44, and a power supply control block 61. The amplifier 70 further includes a non-inverted input voltage terminal $V_{in+}$, an inverted input voltage terminal $V_{in-}$, and an output voltage terminal $V_{out}$. The input amplification stage 41, the output amplification stage 42, the first capacitor 43, and the second capacitor 44 can be as described above with respect to FIG. 2A.

The power supply control block 61 of FIG. 3A includes the common-mode detection block 45, first and second amplification blocks 46, 47, first and second NMOS transistors 48, 68, first and second PMOS transistors 49, 69, first and second Zener diodes 63, 64, first and second bias blocks 65, 66, and a third amplification block 62. The common-mode detection block 45 includes a first input electrically connected to the non-inverted input voltage terminal $V_{in+}$, a second input electrically connected to the inverted input voltage terminal $V_{in-}$, and an output electrically connected to an inverted input of the third amplification block 62. The third amplification block 62 further includes a non-inverted input electrically connected to a cathode of the first Zener diode 63 and to an anode of the second Zener diode 64. The third amplification block 62 further includes an output electrically connected to a first terminal of the first bias block 65 and to a first terminal of the second bias block 66.

The first bias block 65 further includes a second terminal electrically connected to a gate of the second NMOS transistor 68. The second NMOS transistor 68 further includes a source electrically connected to the high voltage power low supply $V_1$ and a drain electrically connected to an anode of the first Zener diode 63 and to an inverted input of the first amplification block 46. The first amplification block 46 further includes an output electrically connected to a gate of the first NMOS transistor 48 and a non-inverted input electrically connected to a drain of the first NMOS transistor 48 at a node of the power supply control block 61 configured to generate the power low supply $V_{PWRL}$. The first NMOS transistor 48 further includes a source electrically connected to the high voltage power low supply $V_1$. The second bias block 66 further includes a second terminal electrically connected to a gate of the second PMOS transistor 69. The second PMOS transistor 69 further includes a source electrically connected to the high voltage power high supply $V_2$ and a drain electrically connected to a cathode of the second Zener diode 64 and to an inverted input of the second amplification block 47. The second amplification block 47 further includes an output electrically connected to a gate of the first PMOS transistor 49 and a non-inverted input electrically connected to a drain of the first PMOS transistor 49 at a node of the power supply control block 61 configured to generate the power high supply $V_{PWRH}$. The first PMOS transistor 49 further includes a source electrically connected to the high voltage power high supply $V_2$.

The first and second Zener diodes 63, 64 can aid in providing a feedback voltage signal to the third amplification block 62 while helping to bias the non-inverting inputs of the first and second amplification blocks 46, 47 at voltage levels suitable for generating the power high and power low supplies $V_{PWRH}$, $V_{PWRL}$. Additionally, the second Zener diode 64 can provide low impedance to a source current generated by the second PMOS transistor 69 and the first Zener diode 63 can provide low impedance to a sink current generated by the second NMOS transistor 68. The first and second Zener diodes 63, 64 can be used to provide a substantially constant voltage drop across for a wide range of diode current values. Thus, including the first and second Zener diodes 63, 64 can provide enhanced performance. Although FIG. 3A illustrates a configuration using Zener diodes, in certain implementations the first and second Zener diodes 63, 64 can be omitted in favor of using different other components, including, for example, shunt regulators and/or resistors.

The third amplification block 62 is electrically connected in a feedback configuration in which the output voltage of the third amplification block 62 can be controlled such that the non-inverted and inverted inputs of the third amplification block 62 are substantially equal. Since the inverted input of the third amplification block 62 is configured to receive a reference signal from the common-mode detection block 45 that is indicative of the amplifier's common-mode input voltage, the feedback can operate to control the non-inverted input of the third amplification block 62 to be about equal to the amplifier's common-mode input voltage. Additionally, the first Zener diode 63 can provide a voltage to the inverted input of the first amplification stage 46 that is about equal to $V_{CM}-V_{Z1}$, where $V_{Z1}$ is the voltage drop across the first Zener diode 63 and $V_{CM}$ is a reference signal voltage, such as a reference signal indicative of the amplifier's common-mode input voltage. Furthermore, the second Zener diode 64 can provide a voltage to the inverted input of the second amplification stage 47 that is about equal to $V_{CM}+V_{Z2}$, where $V_{Z2}$ is the voltage drop across the second Zener diode 64.

Figure 3B:
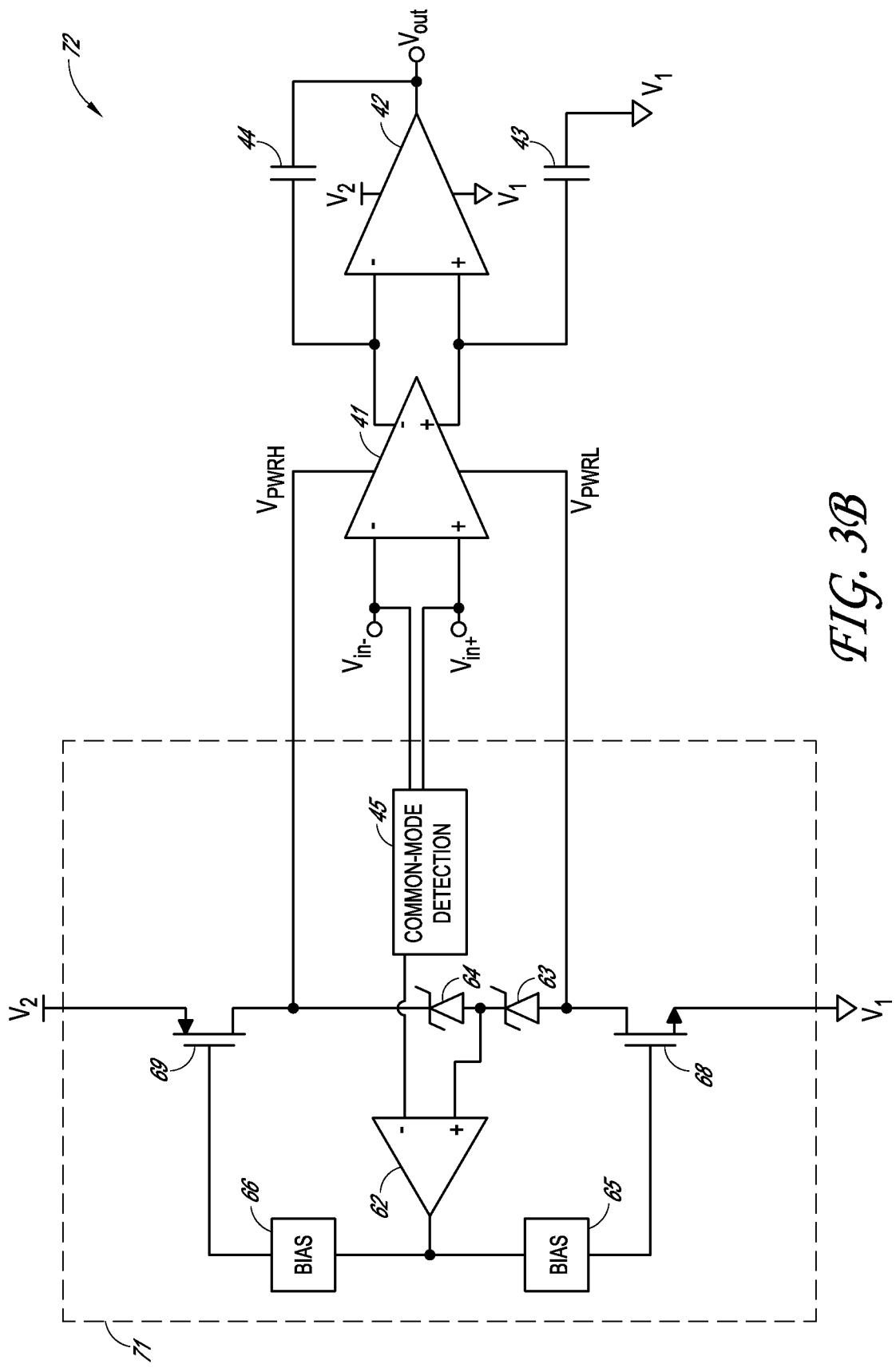
FIG. 3B is a circuit diagram of another embodiment of an amplifier.

FIG. 3B is a circuit diagram of another embodiment of an amplifier 72. The amplifier 72 includes the input amplification stage 41, the output amplification stage 42, the first capacitor 43, the second capacitor 44, and a power supply control block 71. The amplifier 70 further includes the non-inverted input voltage terminal $V_{in+}$, the inverted input voltage terminal $V_{in-}$, and the output voltage terminal $V_{out}$.

The amplifier 72 of FIG. 3B is similar to the amplifier 70 of FIG. 3A, except that the amplifier 72 includes a different arrangement of a power supply control block. For example, in contrast to the power supply control block 61 of FIG. 3A which includes the first and second amplification blocks 46, 47 and the first NMOS and first PMOS transistors 48, 49, the power supply control block 71 illustrates a configuration in which these components have been omitted. For example, as shown in FIG. 3B, rather than using the first amplification block 46 and the first NMOS transistor 48 to generate the power low supply $V_{PWRL}$, the power supply control block 71 uses the second NMOS transistor 68 to generate the power low supply $V_{PWRL}$. Additionally, rather than using the second amplification block 47 and the first PMOS transistor 49 to generate the power high supply $V_{PWRH}$, the power supply control block 71 uses the second PMOS transistor 69 to generate the power high supply $V_{PWRH}$.

Figure 4:
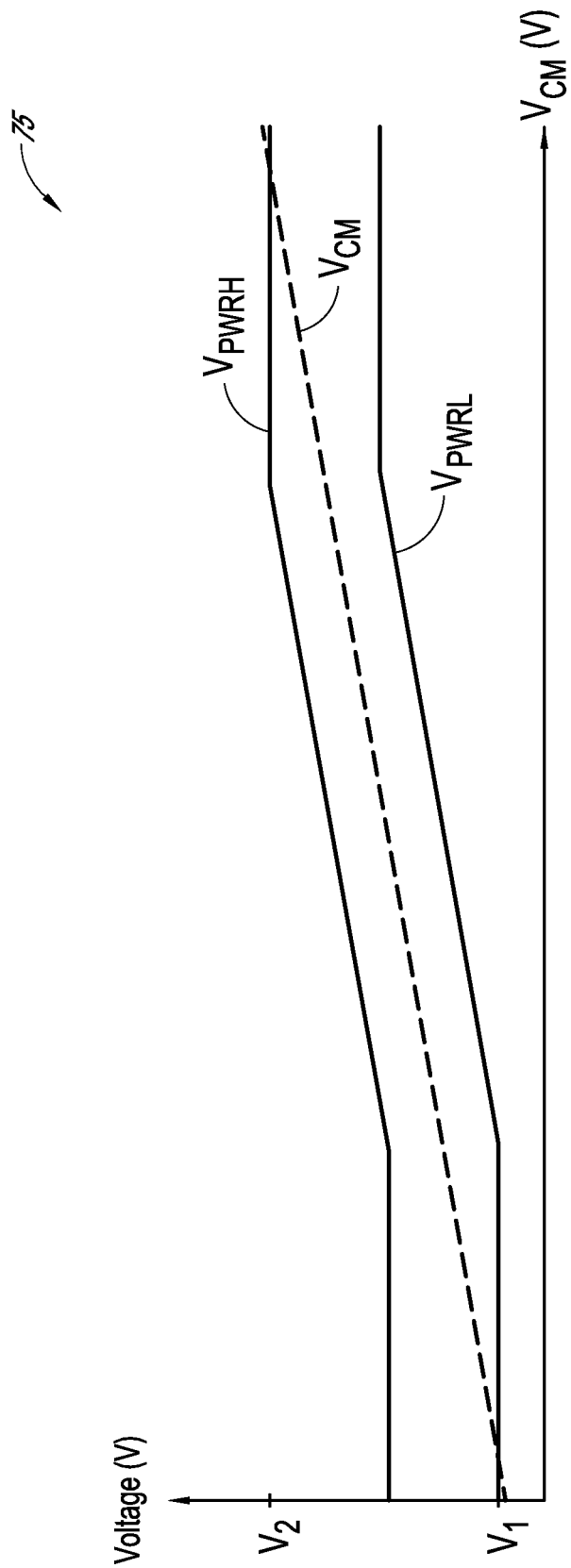
FIG. 4 is a graph of power supply voltage versus common-mode input voltage for one example of an amplifier.

FIG. 4 is a graph 75 of power supply voltage versus common-mode input voltage for one example of an amplifier. The graph 75 can illustrate, for example, the voltage levels of the power high supply $V_{PWRL}$, and the power low supply $V_{PWRH}$ versus the common-mode input voltage for one implementation of the amplifier 10 of FIG. 1.

As shown in FIG. 4, the voltage levels of the power high and power low supplies $V_{PWRH}$, $V_{PWRL}$ can track the common-mode input voltage $V_{CM}$ while being clamped or limited at the high voltage power high and power low supplies $V_2$, $V_1$, respectively. The voltage difference between the power high and power low supplies $V_{PWRH}$, $V_{PWRL}$ can be substantially constant across the common-mode input voltage $V_{CM}$. In one embodiment, a voltage difference between the power high supply $V_{PWRH}$ and the power low supply $V_{PWRL}$ is configured to be in the range of about 2.3 V to about 2.7 V.

Figure 5:
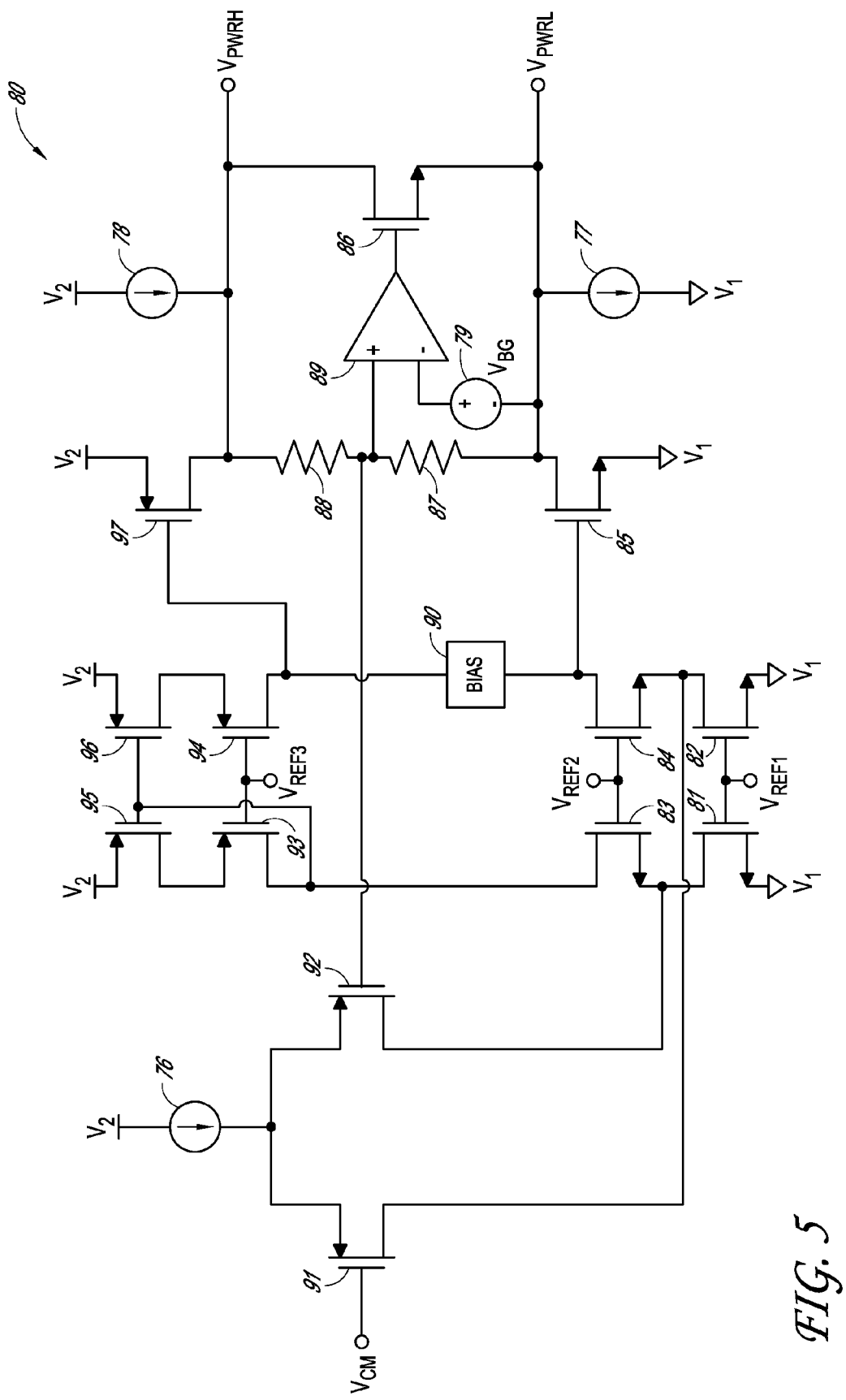
FIG. 5 is a circuit diagram of one embodiment of a power supply control block.

FIG. 5 is a circuit diagram of one embodiment of a power supply control block 80. The power supply control block 80 includes first to third current sources 76-78, first to sixth NMOS transistors 81-86, first to seventh PMOS transistors 91-97, a bandgap reference voltage source 79, first and second resistors 87, 88, an amplification circuit 89, and a bias circuit 90. The power supply control block 80 is configured to receive a reference signal $V_{CM}$, which is indicative of a common-mode input voltage of an amplifier. The power supply control block 80 is further configured to generate a power high supply $V_{PWRH}$ and a power low supply $V_{PWRL}$.

The first PMOS transistor 91 includes a gate electrically connected to the reference signal $V_{CM}$ and a source electrically connected to a source of the second PMOS transistor 92 and to a first terminal of the first current source 76. The first current source 76 further includes a second terminal electrically connected to the high voltage power high supply $V_2$. The first PMOS transistor 91 further includes a drain electrically connected to a drain of the second NMOS transistor 82 and to a source of the fourth NMOS transistor 84. The second PMOS transistor 92 further includes a drain electrically connected to a drain of the first NMOS transistor 81 and to a source of the third NMOS transistor 83. The first and second NMOS transistor 81, 82 each further include a source electrically connected to the high voltage power low supply $V_1$ and a gate electrically connected to a first voltage reference $V_{REF1}$. The third NMOS transistor 83 further includes a drain electrically connected to a drain of the third PMOS transistor 93, to a gate of the fifth PMOS transistor 95, and to a gate of the sixth PMOS transistor 96. The fourth NMOS transistor 84 further includes a drain electrically connected to a first terminal of the bias circuit 90 and to a gate of the fifth NMOS transistor 85. The third and fourth NMOS transistor 83, 84 each further include a gate electrically connected to a second voltage reference $V_{REF2}$. The fifth NMOS transistor 85 further includes a source electrically connected to the high voltage power low supply $V_1$.

The third and fourth PMOS transistors 93, 94 each include a gate electrically connected to a third voltage reference $V_{REF3}$. The third PMOS transistor 93 further includes a source electrically connected to a drain of the fifth PMOS transistor 95. The fourth PMOS transistor 94 further includes a source electrically connected to a drain of the sixth PMOS transistor 96. The fifth and sixth PMOS transistors 95, 96 each further include a source electrically connected to the high voltage power high supply $V_2$. The fourth PMOS transistor 94 further includes a drain electrically connected to a gate of the seventh PMOS transistor 97 and to a second terminal of the bias circuit 90. The seventh PMOS transistor 97 further includes a source electrically connected to the high voltage power high supply $V_2$ and a drain electrically connected to a first end of the second resistor 88, to a first terminal of the third current source 78, and to a drain of the sixth NMOS transistor 86 at a node configured to generate the power high supply $V_{PWRH}$. The third current source 78 further includes a second terminal electrically connected to the high voltage power high supply $V_2$. The second resistor 88 further includes a second end electrically connected to a gate of the second PMOS transistor 92, to a first end of the first resistor 87, and to a positive or non-inverted input of the amplification circuit 89. The first resistor 87 further includes a second end electrically connected to a drain of the fifth NMOS transistor 85, to a first terminal of the bandgap reference voltage source 79, to a first terminal of the second current source 77, and to a source of the sixth NMOS transistor 86 at a node configured to generate the power low supply $V_{PWRL}$. The second current source 77 further includes a second terminal electrically connected to the high voltage power low supply $V_1$. The bandgap reference voltage source 79 further includes a second terminal electrically connected to a negative or inverted input of the amplification circuit 89. The amplification circuit 89 further includes an output electrically connected to a gate of the sixth NMOS transistor 86.

The bandgap reference voltage source 79 can be configured to generate an output voltage based on a bandgap voltage of silicon, such as an output voltage of about 1.26 V at room temperature. Additionally, the amplification circuit 89 is electrically connected in a feedback configuration and can control a voltage of the gate of the sixth NMOS transistor 86 to vary a flow of current through the sixth NMOS transistor 86 relative to a flow of current through the first and second resistors 87, 88, which form a voltage divider. The amplification circuit 89 can control the gate voltage of the sixth NMOS transistor 86 such that a voltage across the first resistor 87 is about equal to the voltage of the bandgap reference voltage source 79. Additionally, a resistance of the second resistor 88 can be controlled relative to a resistance of the first resistor 87 so as to control a voltage difference between the power high supply $V_{PWRH}$ and the power low supply $V_{PWRL}$. For example, when the first and second resistors 87, 88 are configured to have about the same resistance, the voltage difference between the power high supply $V_{PWRH}$ and the power low supply $V_{PWRL}$ can be about equal to twice the voltage of the bandgap reference voltage source 79.

The first to fifth NMOS transistors 81-85 and the first to seventh PMOS transistors 91-97 are electrically connected in a feedback configuration that can be used to change the voltage levels of the power high and power low supplies $V_{PWRH}$, $V_{PWRL}$ in relation to a voltage level of the reference signal $V_{CM}$, while clamping the power low supply $V_{PWRL}$ at the high voltage power low supply $V_1$ and clamping the power high supply $V_{PWRH}$ at the high voltage power high supply $V_2$. For example, the first to fourth NMOS transistors 81-84 and the third to sixth PMOS transistors 93-96 can amplify a difference between the gate voltages of the first and second PMOS transistors 91, 92 to control the gate voltages of the fifth NMOS transistor 85 and the seventh PMOS transistor 97. Since the gate of the first PMOS transistor 91 is configured to receive the reference signal $V_{CM}$, the first to fourth NMOS transistors 81-84 and the first to sixth PMOS transistors 91-96 can control the current through the fifth NMOS transistor 85 and the seventh PMOS transistor 97 to reduce a voltage difference between the first and second PMOS transistors 91, 92. When the reference signal $V_{CM}$ is far from the high voltage power high and power low supplies $V_2$, $V_1$, the feedback can result in the gate voltage of the second PMOS transistor 92 being about equal to the reference signal $V_{CM}$. However, for relatively high voltage levels of the reference signal $V_{CM}$, the seventh PMOS transistor 97 can operate to clamp the power high supply $V_{PWRH}$ at the high voltage power high supply $V_2$. Similarly, for relatively low voltage levels of the reference signal $V_{CM}$, the fifth NMOS transistor 85 can operate to clamp the power low supply $V_{PWRL}$ at the high voltage power low supply $V_1$.

Figure 6:
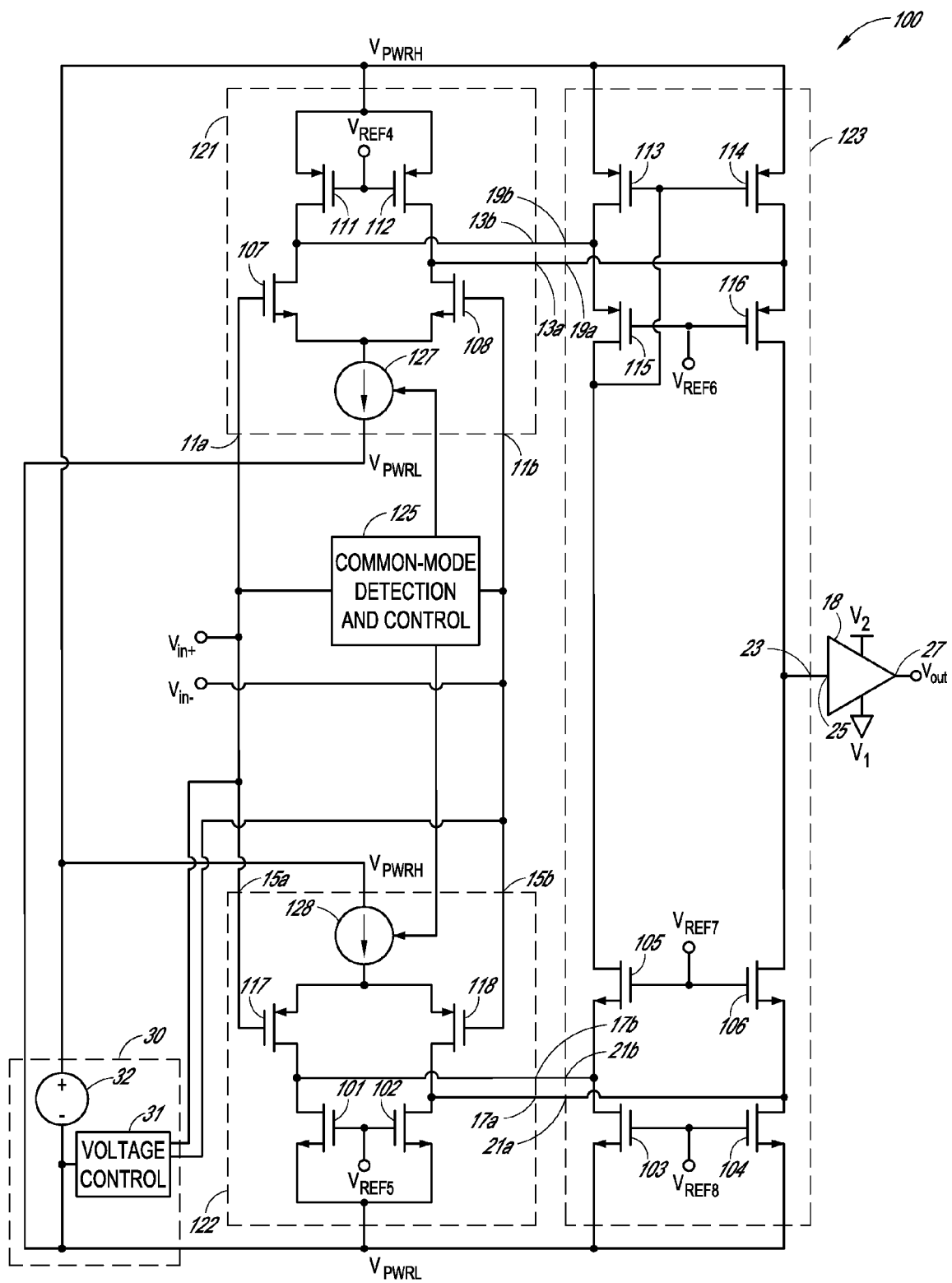
FIG. 6 is a circuit diagram of another embodiment of an amplifier.

FIG. 6 is a circuit diagram of another embodiment of an amplifier 100. The amplifier 100 includes first to third amplification stages 121-123, the fourth amplification stage 18, the power supply control block 30, and a common-mode detection and control block 125. The amplifier 100 further includes a non-inverted input voltage terminal $V_{in+}$, an inverted input voltage terminal $V_{in-}$, and an output voltage terminal $V_{out}$.

The amplifier 100 is electrically connected in the configuration described earlier with respect to FIG. 1B. For example, the non-inverted input voltage terminal $V_{in+}$ of the amplifier 100 is electrically connected to a non-inverted input 11a of the first amplification stage 121 and to a non-inverted input 15a of the second amplification stage 122. Additionally, the inverted input voltage terminal $V_{in-}$ of the amplifier 100 is electrically connected to an inverted input 11b of the first amplification stage 121 and to an inverted input 15b of the second amplification stage 122. Furthermore, a non-inverted output 13a and an inverted output 13b of the first amplification stage 121 are electrically connected to a first non-inverted input 19a and to a first inverted input 19b of the third amplification stage 123, respectively. Additionally, a non-inverted output 17a and an inverted output 17b of the second amplification stage 122 are electrically connected to a second non-inverted input 21a and to a second inverted input 21b of the third amplification stage 123, respectively. Furthermore, an output 23 of the third amplification stage 110 is electrically connected to an input 25 of the fourth amplification stage 18, and an output 27 of the fourth amplification stage 18 is electrically connected to the output voltage terminal $V_{out}$ of the amplifier 100.

However, in contrast to the amplifier 20 of FIG. 1B in which the power supply control block 30 electrically powers the first and second amplification stages 12, 14, but not the third amplification stage 16, the amplifier 100 of FIG. 6 illustrates a configuration in which the first to third amplification stages 121-123 are powered using the power supply control block 30. In both the amplifier 20 of FIG. 1B and the amplifier 100 of FIG. 6, the fourth amplification stage 18 is powered using the high voltage power high and power low supplies $V_2$, $V_1$. In certain implementations, amplifiers are provided in which input stages and one or more intermediate amplification stages are powered using a power supply control block, but an output stage can be powered using high voltage power supplies so as to permit the output signal to have a relatively large output voltage swing range.

The first amplification stage 121 includes a first low voltage input NMOS transistor 107, a second low voltage input NMOS transistor 108, a first low voltage PMOS load transistor 111, a second low voltage PMOS load transistor 112, and a first current source 127. The first low voltage input NMOS transistor 107 includes a gate electrically connected to the non-inverted input 11a, a drain electrically connected to the inverted output 13b, and a source electrically connected to a source of the second low voltage input NMOS transistor 108 and to a first terminal of the first current source 127. The first current source 127 further includes a second terminal electrically connected to the power low supply $V_{PWRL}$ and a control input configured to receive a control signal from the common-mode detection and control block 125. The second low voltage input NMOS transistor 108 further includes a gate electrically connected to the inverted input 11b and a drain electrically connected to the non-inverted output 13a. The first low voltage PMOS load transistor 111 includes a source electrically connected to the power high supply $V_{PWRH}$, a drain electrically connected to the inverted output 13b, and a gate electrically connected to a fourth reference voltage $V_{REF4}$. The second low voltage PMOS load transistor 112 includes a source electrically connected to the power high supply $V_{PWRH}$, a drain electrically connected to the non-inverted output 13a, and a gate electrically connected to the fourth reference voltage $V_{REF4}$.

The second amplification stage 122 includes a first low voltage input PMOS transistor 117, a second low voltage input PMOS transistor 118, a first low voltage NMOS load transistor 101, a second low voltage NMOS load transistor 102, and a second current source 128. The first low voltage input PMOS transistor 117 includes a gate electrically connected to the non-inverted input 15a, a drain electrically connected to the inverted output 17b, and a source electrically connected to a source of the second low voltage input PMOS transistor 118 and to a first terminal of the second current source 128. The second current source 128 further includes a second terminal electrically connected to the power high supply $V_{PWRH}$ and a control input configured to receive a control signal from the common-mode detection and control block 125. The second low voltage input PMOS transistor 118 further includes a gate electrically connected to the inverted input 15b and a drain electrically connected to the non-inverted output 17a. The first low voltage NMOS load transistor 101 includes a source electrically connected to the power low supply $V_{PWRL}$, a drain electrically connected to the inverted output 17b, and a gate electrically connected to a fifth reference voltage $V_{REF5}$. The second low voltage NMOS load transistor 102 includes a source electrically connected to the power low supply $V_{PWRL}$, a drain electrically connected to the non-inverted output 17a, and a gate electrically connected to the fifth reference voltage $V_{REF5}$.

The third amplification stage 123 includes first to fourth low voltage PMOS transistors 113-116 and first to fourth low voltage NMOS transistors 103-106. The first low voltage PMOS transistor 113 includes a source electrically connected to the power high supply $V_{PWRH}$, a drain electrically connected to the first inverted input 19b, and a gate electrically connected to a gate of the second low voltage PMOS transistor 114, to a drain of the third low voltage PMOS transistor 115, and to a drain of the third low voltage NMOS transistor 105. The second low voltage PMOS transistor 114 further includes a source electrically connected to the power high supply $V_{PWRH}$ and a drain electrically connected to the first non-inverted input 19a. The third low voltage PMOS transistor 115 further includes a source electrically connected to the first inverted input 19b and a gate electrically connected to a sixth reference voltage $V_{REF6}$. The fourth low voltage PMOS transistor 116 further includes a gate electrically connected to the sixth reference voltage $V_{REF6}$ and a drain electrically connected to the output 23. The third low voltage NMOS transistor 105 further includes a source electrically connected to the second inverted input 21b and a gate electrically connected to the seventh reference voltage $V_{REF7}$. The first low voltage NMOS transistor 103 includes a source electrically connected to the power low supply $V_{PWRL}$, a drain electrically connected to the second inverted input 21b, and a gate electrically connected to an eighth reference voltage $V_{REF8}$. The second low voltage NMOS transistor 104 includes a source electrically connected to the power low supply $V_{PWRL}$, a drain electrically connected to the second non-inverted input 21a, and a gate electrically connected to the eighth reference voltage $V_{REF8}$. The fourth low voltage NMOS transistor 106 includes a source electrically connected to the second non-inverted input 21a, a drain electrically connected to the output 23, and a gate electrically connected to the seventh reference voltage $V_{REF7}$.

The amplifier 100 includes the power supply control block 30, which can generate the power high and power low supplies $V_{PWRH}$, $V_{PWRL}$ such that the power high and power low supplies $V_{PWRH}$, $V_{PWRL}$, track the common-mode input voltage while clamping or limiting the power high and power low supplies $V_{PWRH}$, $V_{PWRL}$, at the high voltage power high and power low supplies $V_2$, $V_1$, respectively. The amplifier 100 further includes the common-mode detection and control block 125, which can be used to sense a common-mode voltage level of the non-inverted and inverted input voltage terminals $V_{in+}$, $V_{in-}$ and to enable or disable the first and second amplification stages 121, 122 based on the sensed common-mode voltage level. Configuring the amplifier 100 to include the power supply control block 30 and the common-mode detection and control block 125 can aid the amplifier 100 in operating over a wide range of common-mode input voltages, including, for example, over a common-mode input voltage operating range extending at least between the high voltage power low supply $V_1$ and the high voltage power high supply $V_2$.

In one embodiment, the common-mode detection and control block 125 can be configured to enable the first current source 127 of the first amplification stage 121 and to disable the second current source 128 of the second amplification stage 122 when the common-mode voltage of the non-inverted and inverted input voltage terminals $V_{in+}$, $V_{in-}$ is relatively high, such as a threshold voltage within about 1.2 V of the high voltage power high supply $V_2$. Additionally, the common-mode detection and control block 125 can be configured to disable the first current source 127 of the first amplification stage 121 and to enable the second current source 128 of the second amplification stage 122 when the common-mode voltage of the non-inverted and inverted input voltage terminals $V_{in+}$, $V_{in-}$ is below the threshold voltage.

The fourth to eighth reference voltages $V_{REF4}$-$V_{REF8}$ can be any suitable reference voltages. In certain implementations, the fourth to eighth reference voltages $V_{REF4}$-$V_{REF8}$ are generated using bias circuitry that is powered using the power high and power low supplies $V_{PWRH}$, $V_{PWRL}$. Generating the fourth to eighth reference voltages $V_{REF4}$-$V_{REF8}$ in this manner can aid in biasing the low voltage transistors in the first to third amplification stages 121-123 while avoiding transistor breakdown conditions from gate-to-drain and/or source-to-drain across the amplifier's common-mode input voltage operating range.

Figure 7:
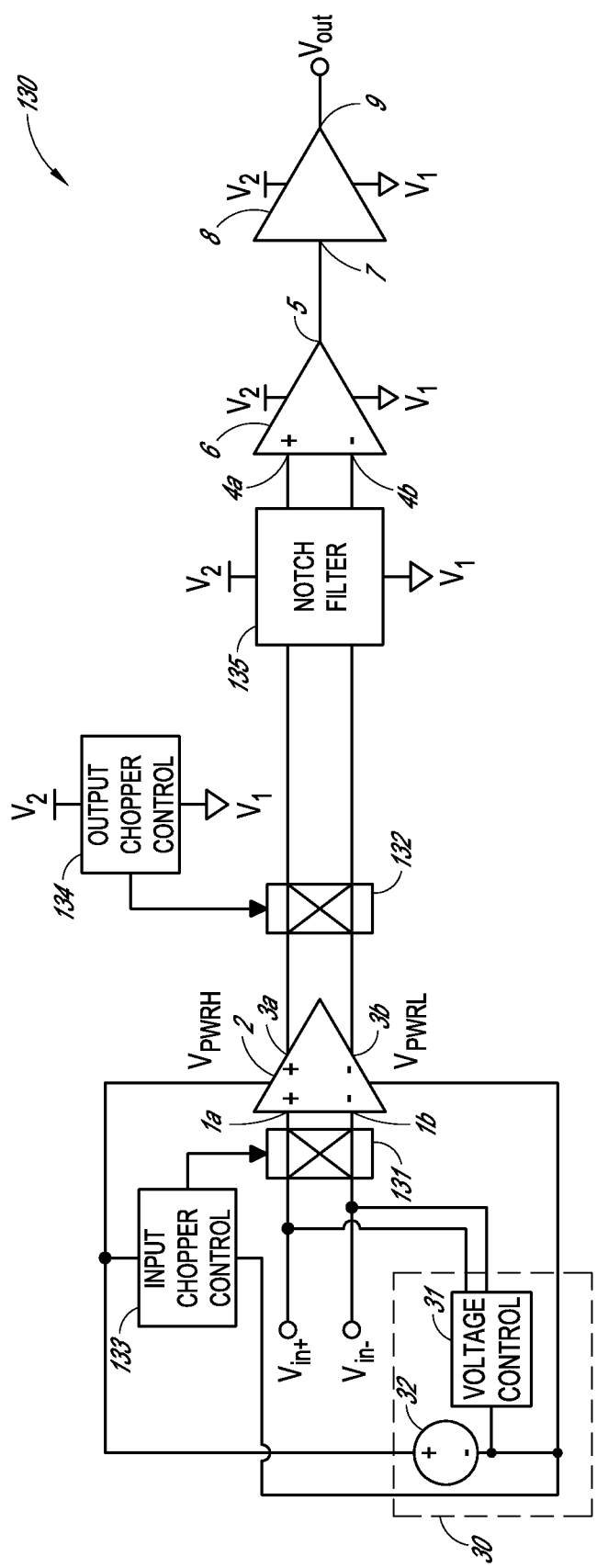
FIG. 7 is a schematic diagram of another embodiment of an amplifier.

FIG. 7 is a schematic diagram of another embodiment of an amplifier 130. The amplifier 130 includes the first amplification stage 2, the second amplification stage 6, the third amplification stage 8, the power supply control block 30, an input chopper circuit 131, an output chopper circuit 132, an input chopper control circuit 133, an output chopper control circuit 134, and a notch filter 135. The amplifier 130 further includes the non-inverted input voltage terminal $V_{in+}$, the inverted input voltage terminal $V_{in-}$, and the output voltage terminal $V_{out}$.

The amplifier 130 of FIG. 7 is similar to the amplifier 10 of FIG. 1A, except that the amplifier 130 further includes the input chopper circuit 131, the output chopper circuit 132, the input chopper control circuit 133, the output chopper control circuit 134, and the notch filter 135. The input chopper circuit 131 includes a clock input configured to receive a first chopping clock signal generated by the input chopper control circuit 133, a differential input electrically connected to the non-inverted and inverted input voltage terminals $V_{in+}$, $V_{in-}$, and a differential output electrically connected to the non-inverted and inverted inputs 1a, 1b of the input amplification stage 2. Additionally, the output chopper circuit 132 includes a clock input configured to receive a second chopping clock signal generated by the output chopper control circuit 134, a differential input electrically connected to the non-inverted and inverted outputs 3a, 3b of the input amplification stage 2, and a differential output electrically connected to a differential input of the notch filter 135. Furthermore, the notch filter 135 includes a differential output electrically connected to the non-inverted and inverted inputs of the second amplification stage 6.

The input chopper circuit 131 can be used to chop the non-inverted and inverted inputs 1a, 1b of the first amplification stage 2 by periodically swapping or chopping the positive and negative input voltage terminals $V_{IN+}$, $V_{IN-}$ at a chopping frequency of the chopping clock signal generated by the input chopper control circuit 133. For example, the input chopper circuit 131 can be used to regularly reverse the polarity of the differential input voltage signal received between the positive and negative input voltage terminals $V_{IN+}$, $V_{IN-}$ provided to the first amplification stage 2. Additionally, the output chopper circuit 132 can be used to chop the non-inverted and inverted outputs 3a, 3b of the first amplification stage 2. The input chopper circuit 131 can operate to upshift the frequency content or spectrum of the amplifier's input signal by the chopping frequency and the output chopper circuit 132 can operate to downshift the frequency content of the amplifier's input signal by the chopping frequency.

The differential output signal generated by the first amplification stage 2 can have a magnitude near the chopping frequency that is proportional to the input offset voltage of the amplifier 130. For example, in the absence of an input signal to the first amplification stage 2, the differential output signal of the first amplification stage 2 can be a square wave signal with a magnitude proportional to the amplifier's input offset voltage and a frequency about equal to the chopping frequency of the chopping clock signal generated by the input chopper control circuit 133. Since such a square wave signal can be equivalently represented by a Fourier series of sine waves at the chopping frequency and at odd harmonics thereof, the differential output signal of the first amplification stage 2 near the chopping frequency can have a magnitude that changes in proportion to the input offset voltage of the amplifier 130. The notch filter 135 can notch the differential output signal of the output chopper circuit 132 at the chopping frequency, thereby reducing or removing the amplifier's input offset voltage. However, the amplifier's input signal can be upshifted by the input chopper circuit 131 and downshifted by the output chopper circuit 132, and thus can substantially pass through the notch filter 135 without attenuation.

As shown in FIG. 7, the input chopper control circuit 133 is powered using the power high supply $V_{PWRH}$ and the power low supply $V_{PWRL}$ generated by the power supply control block 30. By electrically powering the input chopper control circuit 133 in this manner, the input chopper control circuit 133 can generate a chopping clock signal that has a voltage level that changes with the common-mode input voltage of the amplifier 130. In certain embodiments, the power supply control block 30 can be used not only to generate power high and power low supplies for an input amplification stage, but also to generate power high and power low supplies for the input chopper control circuit 133.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. For example, amplifiers can be used in consumer electronic products, parts of the consumer electronic products, electronic test equipment, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
a first input terminal;
a second input terminal;
a first amplification stage configured to amplify a voltage difference between the first and second input terminals to generate a first amplified signal; and
a power supply control block configured to receive a reference signal indicative of at least one of a voltage of the first input terminal or a voltage of the second input terminal, wherein the power supply control block is configured to generate a power high supply and a power low supply for the first amplification stage, and wherein the power supply control block is further configured to control a voltage level of the power high supply and a voltage level of the power low supply based at least in part on the reference signal, and wherein the power supply control block is further configured to generate the power low and power high supplies from a first high voltage power supply and from a second high voltage power supply.

2. The amplifier of claim 1, wherein the power supply control block is configured to control a voltage difference between the power high supply and the power low supply to be substantially constant.

3. The amplifier of claim 2, wherein the power supply control block comprises a voltage source and a voltage control block, wherein the voltage control block is configured to control the voltage level of one of the power low supply or the power high supply based on the reference signal, and wherein the voltage source is configured to control the voltage level of the other of the power low supply or the power high supply such that the voltage difference between the power high supply and the power low supply is substantially constant.

4. The amplifier of claim 2, wherein the amplifier further comprises an output amplification stage, wherein the output amplification stage is configured to amplify the first amplified signal to generate an output signal, and wherein the output amplification stage is powered using the first high voltage power supply and the second high voltage power supply, and wherein a voltage difference between the second and first high voltage power supplies is greater than the voltage difference between the power high supply and the power low supply.

5. The amplifier of claim 4, wherein the power supply control block is further configured to clamp the voltage level of the power low supply at a voltage level of the first high voltage power supply and to clamp the voltage level of the power high supply at a voltage level of the second high voltage power supply.

6. The amplifier of claim 4, wherein the first amplification stage comprises a plurality of low voltage transistors and wherein the output amplification stage comprises a plurality of high voltage transistors, wherein the high voltage transistors have a higher breakdown voltage than the low voltage transistors.

7. The amplifier of claim 1, further comprising an input chopper circuit and an input chopper control circuit, wherein the input chopper circuit is configured to periodically chop the first and second input terminals based on a chopping clock signal generated by the input chopper control circuit, wherein the input chopper control circuit is powered by the power high supply and the power low supply.

8. The amplifier of claim 1, further comprising a second amplification stage configured to amplify the voltage difference between the first and second input terminals to generate a second amplified signal, wherein the second amplification stage is powered by the power high supply and the power low supply.

9. The amplifier of claim 8, further comprising a common-mode detection and control block, wherein the first amplification stage comprises a low voltage n-type input transistor differential pair, and wherein the second amplification stage comprises a low voltage p-type input transistor differential pair, and wherein the common-mode detection and control block is configured to detect a common-mode voltage of the first and second input terminals to generate a detected common-mode voltage, and wherein the common-mode detection and control block is further configured to selectively enable each of the first and second amplification stages based on the detected common-mode voltage, wherein a breakdown voltage of the low voltage n-type input transistor differential pair and a breakdown voltage of the low voltage p-type input transistor differential pair is not suitable for operation with the first high voltage power supply or the second high voltage power supply.

10. The amplifier of claim 9, further comprising a third amplification stage, a fourth amplification stage, and an output terminal, wherein the third amplification stage is configured to combine the first and second amplified signals to generate a third amplified signal, and wherein the fourth amplification stage is configured to amplify the third amplified signal to generate an output signal on the output terminal, and wherein the third amplification stage is powered using the power high supply and the power low supply, and wherein the fourth amplification stage is powered using a first high voltage power supply and a second high voltage power supply.

11. The amplifier of claim 1, further comprising a common-mode detection block configured to generate the reference signal based on a common-mode voltage of the first and second input terminals.

12. The amplifier of claim 1, wherein the reference signal is generated based on a voltage level of the first input terminal.

13. The amplifier of claim 1, wherein the power supply control block further comprises a first Zener diode, a second Zener diode, and an amplification circuit, wherein the first and second Zener diodes are electrically connected in series, and wherein the power supply control block is further configured to control the voltage level of the power high supply based on a voltage level of a cathode of the second Zener diode, and wherein the power supply control block is further configured to control the voltage level of the power low supply based on a voltage level of an anode of the first Zener diode, and wherein the amplification circuit is configured to control a voltage level of a cathode of the first Zener diode and a voltage level of an anode of the second Zener diode based on a voltage level of the reference signal.

14. The amplifier of claim 13, wherein the power supply control block further comprises a first low drop out (LDO)

regulator and a second LDO regulator, wherein the first LDO regulator is configured to control the voltage level of the power low supply based on the voltage level of the anode of the first Zener diode, and wherein the second LDO regulator configured to control the voltage level of the power high supply based on the voltage level of the cathode of the second Zener diode.

15. The amplifier of claim 1, wherein the power supply control block comprises a first resistor, a second resistor, a bandgap reference voltage source, and an amplification circuit, wherein the first and second resistors are electrically connected in series, and wherein the amplification circuit is electrically connected in a feedback configuration that provides a voltage across each of the first and second resistors that is about equal to a voltage of the bandgap reference voltage source.

16. The amplifier of claim 1, wherein the power supply control block is further configured to control the voltage level of the power low supply based on a voltage level of a first end of the first resistor, and wherein the power supply control block is further configured to control the voltage level of the power high supply based on a voltage level of a first end of the second resistor, and wherein the power supply control block is further configured to control a voltage level of a second end of the first resistor and a second end of the second resistor based on a voltage level of the reference signal.

17. An amplifier comprising:
a first input terminal;
a second input terminal;
a first amplification stage configured to amplify a voltage difference between the first and second input terminals to generate a first amplified signal; and
a means for power supply control configured to receive a reference signal indicative of at least one of a voltage of the first input terminal or a voltage of the second input terminal, wherein the power supply control means is configured to generate a power high supply and a power low supply for the first amplification stage, and wherein the power supply control means is further configured to control a voltage level of the power high supply and a voltage level of the power low supply based at least in part on the reference signal, and wherein the power supply control means is further configured to generate the power low and power high supplies from a first high voltage power supply and from a second high voltage power supply.

18. The amplifier of claim 17, wherein the power supply control means is configured to control a voltage difference between the power high supply and the power low supply to be substantially constant.

19. The amplifier of claim 18, wherein the amplifier further comprises an output amplification stage, wherein the output amplification stage is configured to amplify the first amplified signal to generate an output signal, and wherein the output amplification stage is powered using the first high voltage power supply and the second high voltage power supply, and wherein a voltage difference between the second and first high voltage power supplies is greater than the voltage difference between the power high supply and the power low supply.

20. The amplifier of claim 19, wherein the power supply control means is further configured to clamp the voltage level of the power low supply at a voltage level of the first high voltage power supply and to clamp the voltage level of the power high supply at a voltage level of the second high voltage power supply.

21. A method of powering an amplifier, the method comprising:
receiving a first high voltage power supply and a second high voltage power supply;
generating a power low supply and a power high supply from the first and second high voltage power supplies;
receiving a reference signal indicative of at least one of a voltage of a first input terminal of the amplifier or a voltage of a second input terminal of the amplifier;
controlling a voltage level of the power high and power low supplies based at least in part on the reference signal;
powering an input amplification stage of the amplifier with the power high and power low supplies; and
powering an output amplification stage of the amplifier with the first and second high voltage power supplies.

* * * * *